US012407268B2

(12) United States Patent
Liu et al.

(10) Patent No.: US 12,407,268 B2
(45) Date of Patent: Sep. 2, 2025

(54) POWER MODULE OF ISOLATED CONVERTER

(71) Applicant: Delta Electronics (Shanghai) Co., Ltd., Shanghai (CN)

(72) Inventors: Teng Liu, Shanghai (CN); Xin Wang, Shanghai (CN); Liang Wang, Shanghai (CN); Jianxing Dong, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 764 days.

(21) Appl. No.: 17/830,150

(22) Filed: Jun. 1, 2022

(65) Prior Publication Data

US 2022/0407433 A1  Dec. 22, 2022

(30) Foreign Application Priority Data

Jun. 17, 2021  (CN) .................... 202110671225.X

(51) Int. Cl.
*H02M 7/00* (2006.01)
*H01F 27/24* (2006.01)
*H01F 27/28* (2006.01)
*H05K 7/20* (2006.01)
*H05K 9/00* (2006.01)

(52) U.S. Cl.
CPC ............ *H02M 7/003* (2013.01); *H01F 27/24* (2013.01); *H01F 27/288* (2013.01); *H05K 7/2089* (2013.01); *H05K 9/0081* (2013.01)

(58) Field of Classification Search
CPC .. H05K 7/2089; H05K 9/0081; H05K 1/0218; H05K 1/141; H05K 1/144; H01F 27/24; H01F 27/288; H02M 7/003
See application file for complete search history.

(56) References Cited

U.S. PATENT DOCUMENTS

| 9,844,141 B2* | 12/2017 | Sturcken ................. H01F 41/02 |
| 2013/0027170 A1* | 1/2013 | Chen ........................ H01F 5/06 |
| | | 336/200 |
| 2014/0063864 A1* | 3/2014 | Liu .................... H02M 3/33576 |
| | | 361/679.01 |

(Continued)

FOREIGN PATENT DOCUMENTS

| CN | 103259399 A | 8/2013 |
| CN | 104170035 A | 11/2014 |
| CN | 105515375 A | 4/2016 |

(Continued)

*Primary Examiner* — Allen L Parker
*Assistant Examiner* — Dakota M Talbert
(74) *Attorney, Agent, or Firm* — KIRTON McCONKIE; Evan R. Witt

(57) ABSTRACT

A power module of a medium-high-voltage isolated converter is disclosed. The power module includes a first circuit, a second circuit, a transformer and a shielding structure. A potential of the first circuit is greater than a potential of the second circuit. The transformer includes a first leading wire electrically connected to the first circuit, and a second leading wire electrically connected to the second circuit. The shielding structure is disposed between the transformer and the second circuit. The second leading wire is electrically connected between the transformer and the second circuit through the shielding structure, and the shielding structure is maintained at a constant potential.

22 Claims, 15 Drawing Sheets

(56) References Cited

U.S. PATENT DOCUMENTS

2016/0052240 A1* 2/2016 Sargeant ................. B32B 27/36
                                                              428/457
2018/0153046 A1* 5/2018 Xie .......................... H05K 5/04

FOREIGN PATENT DOCUMENTS

| CN | 104578714 B | 6/2017 |
|----|-------------|--------|
| CN | 107017565 A | 8/2017 |
| CN | 108123617 A | 6/2018 |
| CN | 207994943 U | 10/2018 |
| CN | 111599580 A | 8/2020 |
| WO | 2000064020 A1 | 10/2000 |

* cited by examiner

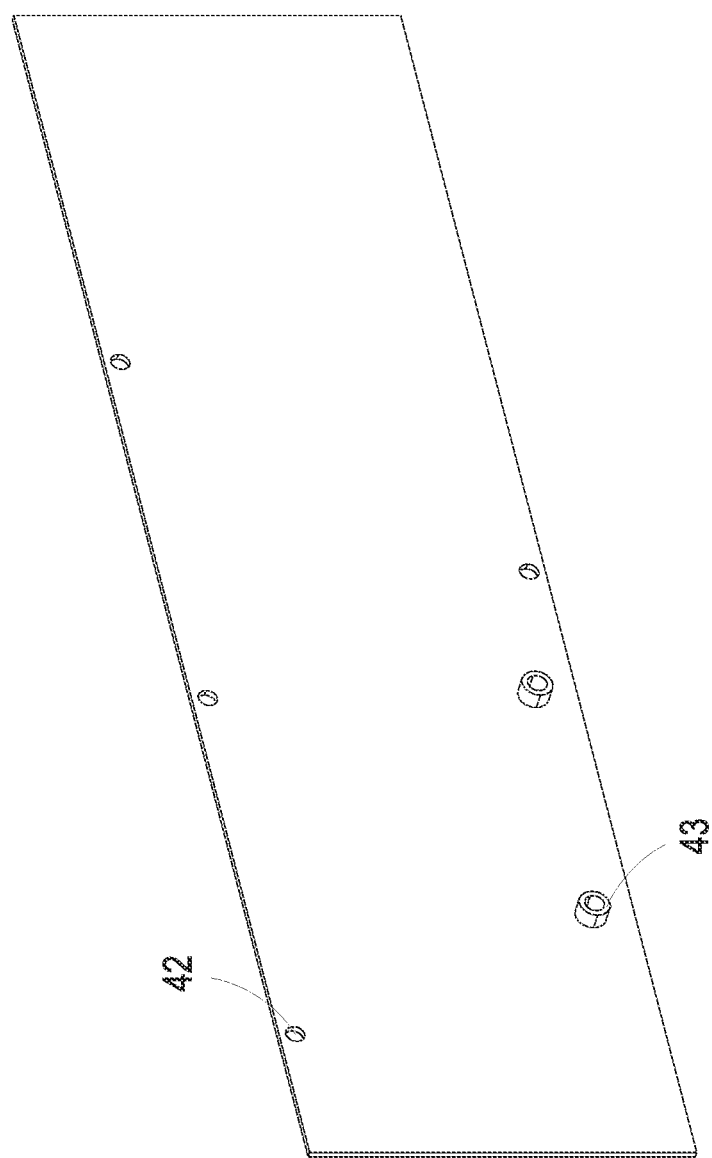

POWER MODULE OF ISOLATED CONVERTER

CROSS-REFERENCE TO RELATED APPLICATION

This application claims priority to China Patent Application No. 202110671225.X, filed on Jun. 17, 2021. The entire contents of the above-mentioned patent application are incorporated herein by reference for all purposes.

FIELD OF THE INVENTION

The present disclosure relates to the field of power electronics, and more particularly to a power module of a medium-high-voltage isolated converter for energy transmission and conversion.

BACKGROUND OF THE INVENTION

An isolated converter usually utilizes a cascaded multi-module topology. In detail, the isolated converter includes a plurality of power modules. Each power module includes a high-voltage circuit, a transformer and a low-voltage circuit. The three sections are arranged together in a single housing. Since people will come into contact with the low-voltage circuit, it is necessary to strictly restrict the high voltage from entering the low-voltage circuit. Further, the reinforced insulation is needed to be designed between the high-voltage circuit and the low-voltage circuit so as to comply with the IEC standard. While the reinforced insulation will apparently increase the distance between the high-voltage circuit and the low-voltage circuit, increase the overall volume of the power module, and reduce the power density of the power module, so that the power density of the isolated converter is reduced.

In addition, there are multiple layout methods for the conventional power modules with the medium-high-voltage isolated converter. One layout method is that the high-voltage circuit and the low-voltage circuit are separated by a solid insulation cylinder to avoid partial discharge in the air gap between the high-voltage circuit and the low-voltage circuit. The high-voltage circuit is disposed inside the solid insulation cylinder and forms an electrical connection with the shielding layer on the inner wall of the solid insulation cylinder. The low-voltage circuit is disposed outside the solid insulation cylinder and forms an electrical connection with the shielding layer on the outer wall of the solid isolation cylinder. The advantage of this layout is that the electric field stress is concentrated inside the solid insulation cylinder, the distance between the high-voltage circuit and the low-voltage circuit is reduced, and the power density of the power module is improved. However, the manufacturing process of the solid insulation cylinder is complicated, the cost is high, the weight is heavy, and the maintenance is not easy. Another layout method is that the power module layout of the isolated converter includes for example a high-voltage circuit, a transformer and a low-voltage circuit arranged in sequence. The outer surface of the high-voltage winding of the transformer is covered with a grounded shielding layer. In this layout, the insulation grade between the high voltage circuit and the low-voltage circuit is basic insulation. The advantage of this layout is that the power module has a smaller size and a higher power density. However, the electric field stress between the leading wire side of the high-voltage winding and the shielding layer is high, and partial discharge risk increases. It leads to premature insulation failure. A special treatment is required for the leading wire side of the high-voltage circuit and the terminal of the shielding layer, and it makes the manufacturing process of the isolated converter complicated and costly.

SUMMARY OF THE INVENTION

An object of the present disclosure is to provide a power module of a medium-high-voltage isolated converter. By arranging the shielding structure reasonably in the power module, the insulation method between the high-voltage circuit and the low-voltage circuit is changed from reinforced insulation to basic insulation, so that the internal safety compliance distance of the power module of the high-voltage isolated converter is reduced. Furthermore, by optimizing the arrangement of the high-voltage circuit, the transformer, the low-voltage circuit and the shielding structure, the safety compliance distance between the high-voltage circuit and the low-voltage circuit is reduced sufficiently, and the overall volume of the power module and the overall weight of the power module are reduced. The power density is increased by 15%. On the other hand, a ventilation airflow channel is formed in the power module of the medium-high-voltage isolated converter for sharing, and combined with the heat sink and the shielding structure in the structural design. In that, the design of the ventilation airflow channel is further simplified, the cost of the power module is reduced, and the competitiveness of the power module is enhanced.

Another object of the present disclosure is to provide a power module of a medium-high-voltage isolated converter. By optimizing the arrangement of the high-voltage circuit, the transformer, the low-voltage circuit and the shielding structure, the shielding structure is maintained at a constant potential, and it is helpful for reducing the safety compliance distance between the high-voltage circuit and the low-voltage circuit. Furthermore, the shielding structure is grounded in conjunction with the heat sink or the housing, or connected to a second circuit, so that the shielding structure is maintained at a constant potential. It is beneficial for simplifying the assembly structure, reducing the cost, simplifying the manufacturing process, and improving the yield and reliability of the product.

In accordance with an aspect of the present disclosure, a power module is provided and includes a first circuit, a second circuit, a transformer and a shielding structure. A potential of the first circuit is greater than a potential of the second circuit. The transformer includes a first leading wire electrically connected to the first circuit, and a second leading wire electrically connected to the second circuit. The shielding structure is disposed between the transformer and the second circuit. The second leading wire is electrically connected between the transformer and the second circuit through the shielding structure, and the shielding structure is maintained at a constant potential.

The beneficial effect of the present disclosure is that the embodiments thereof provide a power module of a medium-high-voltage isolated converter. By properly arranging the shielding structure in the power module, the insulation method between the high-voltage circuit and the low-voltage circuit is changed from reinforced insulation to basic insulation, so that the internal safety compliance distance of the power module is reduced. Furthermore, by optimizing the arrangement of the high-voltage circuit, the transformer, the low-voltage circuit and the shielding structure, the safety compliance distance between the high-voltage circuit and the low-voltage circuit is reduced sufficiently, and the overall volume of the power module and the overall weight of the power module are reduced. The power density is increased by 15%.

The above contents of the present disclosure will become more readily apparent to those ordinarily skilled in the art after reviewing the following detailed description and accompanying drawings, in which:

BRIEF DESCRIPTION OF THE DRAWINGS

FIGS. 3A to 3F schematically show different exemplary structures of the shielding structure of the present disclosure;

DETAILED DESCRIPTION OF THE PREFERRED EMBODIMENT

Figure 1:
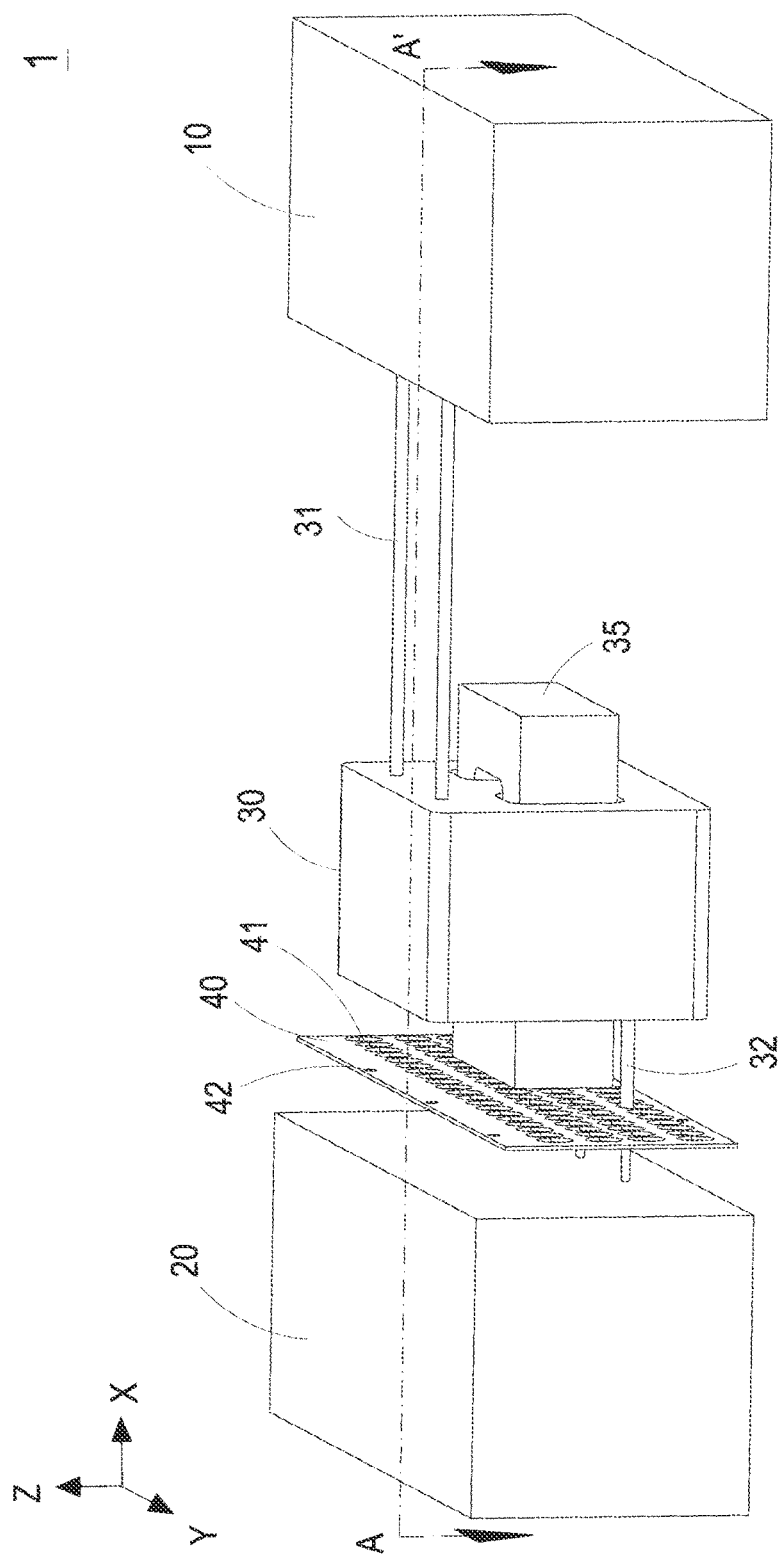
FIG. 1 is a schematic structural view illustrating a power module of an isolated converter according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
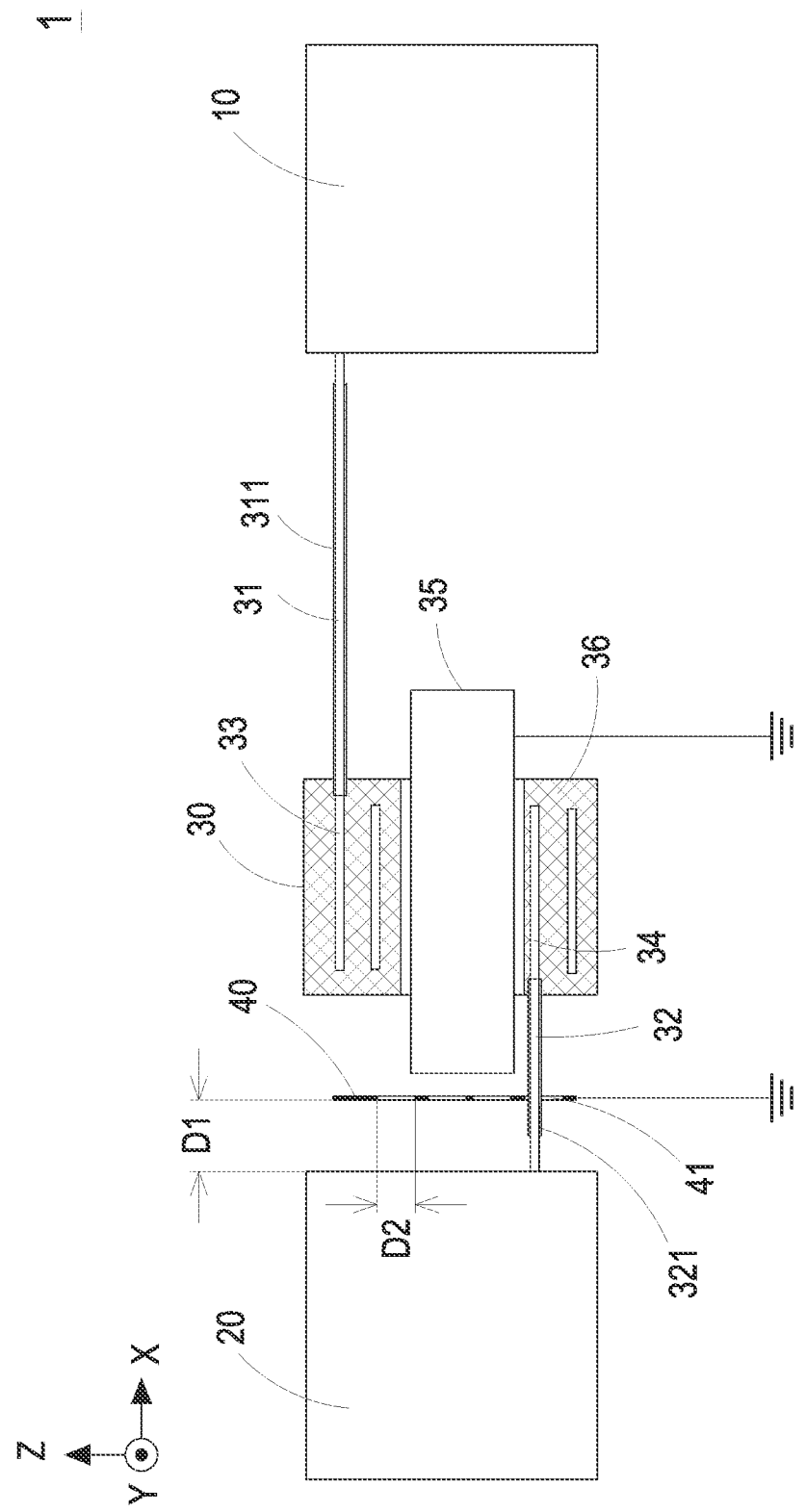
FIG. 2 is a schematic cross-sectional view illustrating the power module of the isolated converter according to the first embodiment of the present disclosure and taken along the line AA'.

In order to achieve energy transmission and conversion between a high-voltage circuit and a low-voltage circuit, the present disclosure provides a power module of an isolated converter. FIG. 1 is a schematic structural view illustrating a power module of an isolated converter according to a first embodiment of the present disclosure. FIG. 2 is a schematic cross-sectional view illustrating the power module of the isolated converter according to the first embodiment of the present disclosure and taken along the line AA'. In the embodiment, the power module 1 includes a first circuit 10, a second circuit 20, a transformer 30 and a shielding structure 40. A potential of the first circuit 10 is greater than a potential of the second circuit 20. Exemplarily but not exclusively, the first circuit 10 is a high-voltage circuit, and the second circuit 20 is a low-voltage circuit. Notably, the "high-voltage circuit" referred to in the present disclosure is not limited to a circuit in which the voltage difference between any two nodes in the circuit is usually high. It meets the requirement of safety compliance isolation of the low-voltage circuit and achieves a required circuit for the medium-high-voltage system. The voltage difference between any two nodes inside the high-voltage circuit may not be high voltage. In the embodiment, the transformer 30 includes a first leading wire 31 electrically connected to the first circuit 10, and a second leading wire 32 electrically connected to the second circuit 20. In the embodiment, the first leading wire 31 is sleeved with an insulation sleeve 311, and the second leading wire 32 is sleeved with an insulation sleeve 321. In the embodiment, the shielding structure 40 is disposed between the transformer 30 and the second circuit 20. The second leading wire 32 is electrically connected between the transformer 30 and the second circuit 20 through the shielding structure 40. The shielding structure 40 is maintained at a constant potential. For example, the shielding structure 40 is grounded or connected to the second circuit 20, so that the shielding structure 40 is maintained at a zero potential, or a constant potential of the second circuit 20.

In the embodiment, the transformer 30 further includes a first winding 33, a second winding 34 and a magnetic core 35. The first winding 33 and the second winding 34 are covered by a solidified insulation. An airflow channel is formed between the solidified insulation and the magnetic core 35. The airflow channel is helpful for improving the heat dissipation effect of the transformer 30. The first winding 33 is a high-voltage winding, and the second winding 34 is a low-voltage winding. The first winding 33 and the second winding 34 are disposed around the same magnetic column of the magnetic core 35. In the embodiment, the first winding 33 is wounded around the magnetic column of the magnetic core 35, and the second winding 34 is disposed around an outside of first winding 33. The present disclosure is not limited thereto. In addition, the first winding 33 is electrically connected to the first circuit 10 through the first leading wire 31, and the second winding 34 is electrically connected to the second circuit 20 through the second leading wire 32. In the embodiment, the magnetic core 35 and the shielding structure 40 are both grounded. In an embodiment, the magnetic core 35 and the shielding structure 40 are in contact with each other, and the shielding structure 40 is grounded.

Figure 3A:
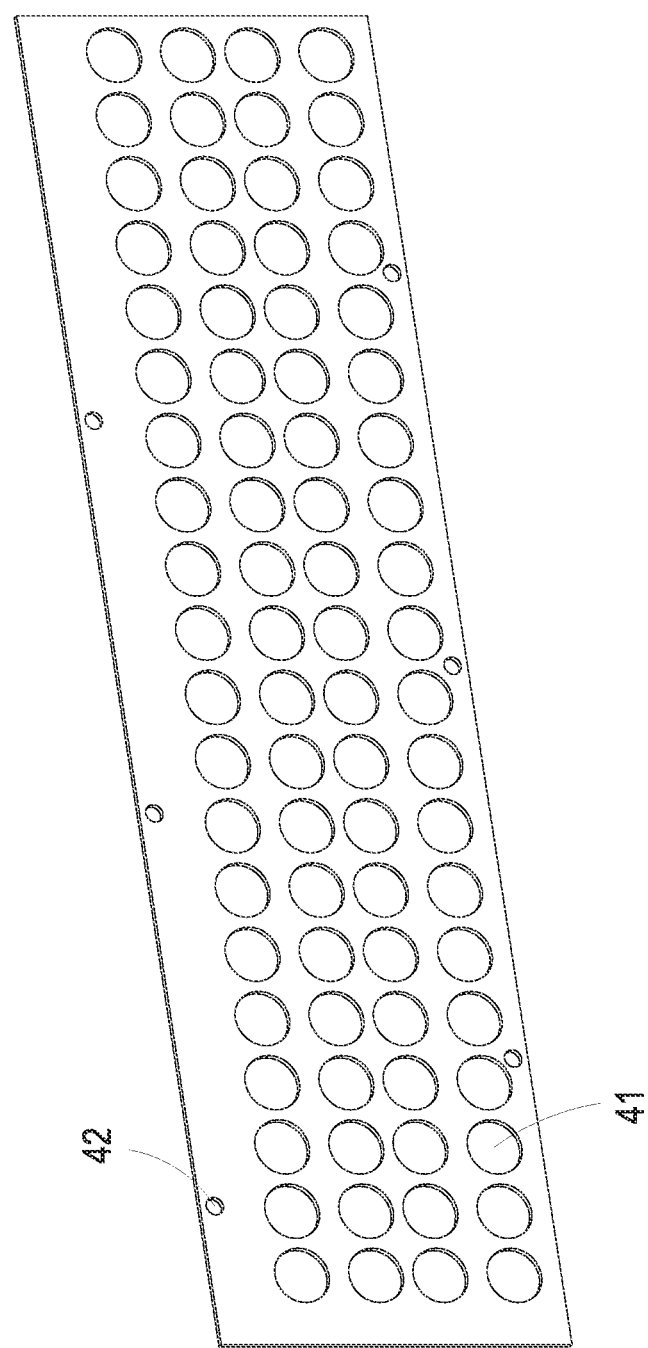

FIG. 3A schematically shows a first exemplary structures of the shielding structure of the present disclosure. The shielding structure 40 includes at least one aperture 41 and at least one mounting hole 42. In detail, the second leading wire 32 passes through the shielding structure 40 through the at least one aperture 41, and electrically connected between the second winding 34 and the second circuit 20. The at least one mounting hole 42 is used for fixing the shielding structure 40. In the embodiment, the first winding 33 and the second winding 34 are a high-voltage winding and a low-voltage winding, respectively. The first winding 33 and the second winding 34 are disposed around the same magnetic column of the magnetic core 35, respectively. The first winding 33 is electrically connected to the first circuit 10 through the first leading wire 31, and the second winding 34 is electrically connected to the second circuit 20 through the second leading wire 32. The method of winding the first winding 33 and the second winding 34 around the same magnetic column of the magnetic core 35 is not limited in the present disclosure. Moreover, in the embodiment, the first leading wire 31 and the second leading wire 32 are sleeved with an insulation sleeve 311 and an insulation sleeve 321, respectively, or covered with an insulation layer. In the embodiment, the thickness of the insulation sleeve 311 of the first leading wire 31 and the thickness of the insulation sleeve 321 of the second leading wire 32 meets the withstand voltage and insulation requirements of relevant standards. In the embodiment, the transformer 30 also includes an insulation layer 36, which covers the first winding 33 and the second winding 34, so that the insulation between the first winding 33 and the second winding 34 meets the reinforced insulation requirement. Moreover, the electrical clearance between the first winding 33 and the magnetic core 35 meets the basic insulation requirement, and the insulation between the magnetic core 35 and the second winding 34 meets the basic insulation requirement.

In the embodiment, when the basic insulation between the first circuit 10 and the magnetic core 35 of the transformer 30 fails, since the magnetic core 35 is not a conductor, although the magnetic core 35 is grounded, it still causes the potential of the magnetic core 35 to be raised. In the embodiment, by disposing the shielding structure 40 between the transformer 30 and the second circuit 20, the influence of the high-potential magnetic core 35 on the second circuit 20 is avoided. Since the conventional power module of the isolated converter does not have the shielding structure 40, the electrical clearance between the first circuit 10 and the second circuit 20 must meet the reinforced insulation requirement. In the embodiment, the electrical clearance between the first circuit 10 and the magnetic core 35 of the transformer 30 only needs to meet the basic insulation requirement. Further, it is dispensable to have the electrical clearance between the magnetic core 35 of the transformer 30 and the second circuit 20 for the basic insulation. In other words, by utilizing the arrangement of the power module 1 of the present disclosure, the safety compliance distances among the first circuit 10 of the high-voltage circuit, the magnetic core 35 and the second circuit 20 of the low-voltage circuit are changed from a reinforced insulation distance to a basic insulation distance. Thus, the entire volume of the power module 1 will be reduced sufficiently, and the power density thereof will be increased by 15%.

In the embodiment, the shielding structure 40 disposed between the transformer 30 and the second circuit 20 is for example but not limited to a shielding plate. In other embodiments, the shielding structure 40 is one selected from the group consisting of a metal shielding plate, a metal shielding mesh, a metal conductor and a conductive sprayed body, so as to achieve a better heat dissipation effect. In the embodiment, the shielding structure 40 and the second circuit 20 have a distance D1. The at least one aperture 41 disposed on the shielding structure 40 has a diameter D2. The diameter D2 of the at least one aperture 41 is less than or equal to the distance D1 between the shielding structure 40 and the second circuit 20, so that the shielding structure 40 maintains an effective shielding effect between the transformer 30 and the second circuit 20. For example, the shape of the at least one aperture 41 is not limited in the present disclosure. In other embodiments, the shape of the aperture 41 is adjustable according to the practical requirements. The diameter D2 of the aperture 41 is less than or equal to the distance D1 from the shielding structure 40 to the second circuit 20. Thus, the shielding structure 40 is helpful for reducing the safety compliance distance of the power module 1 and achieving the functions of ventilation and heat dissipation.

Figure 3B:
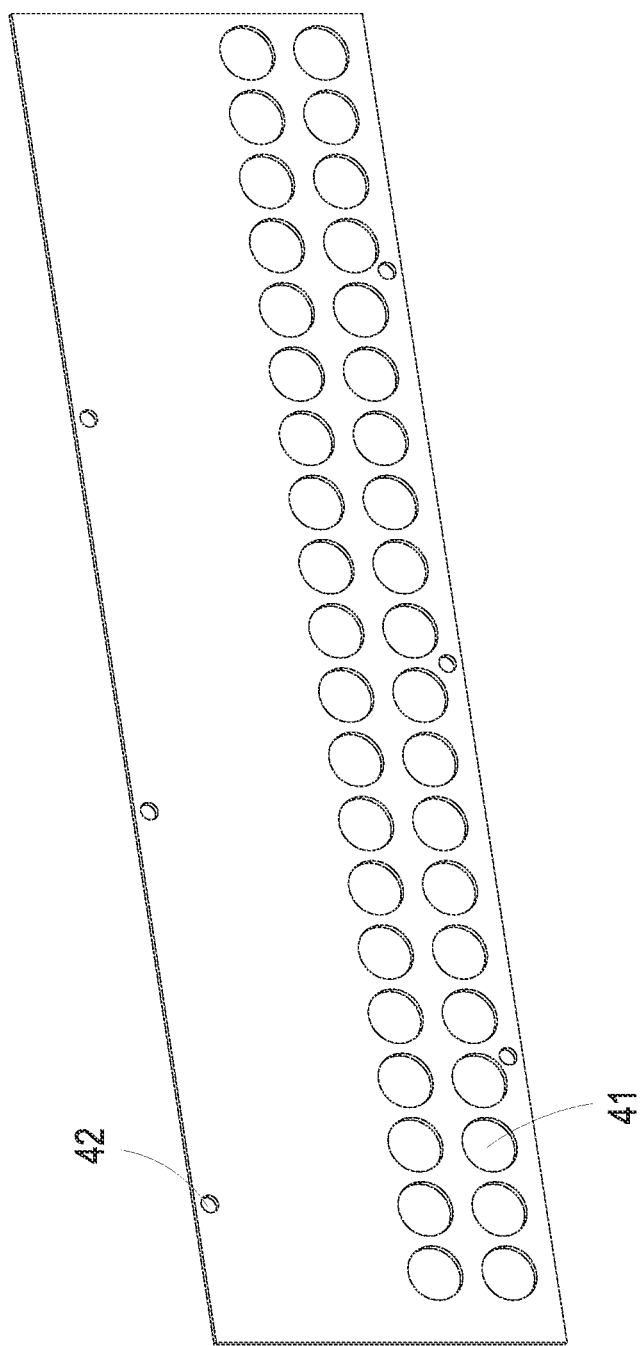
Figure 3D:
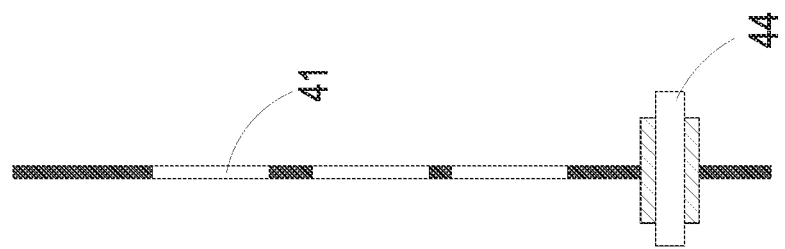
Figure 3C:
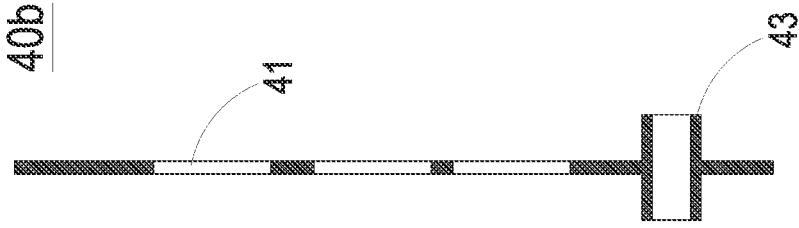
Figure 3F:
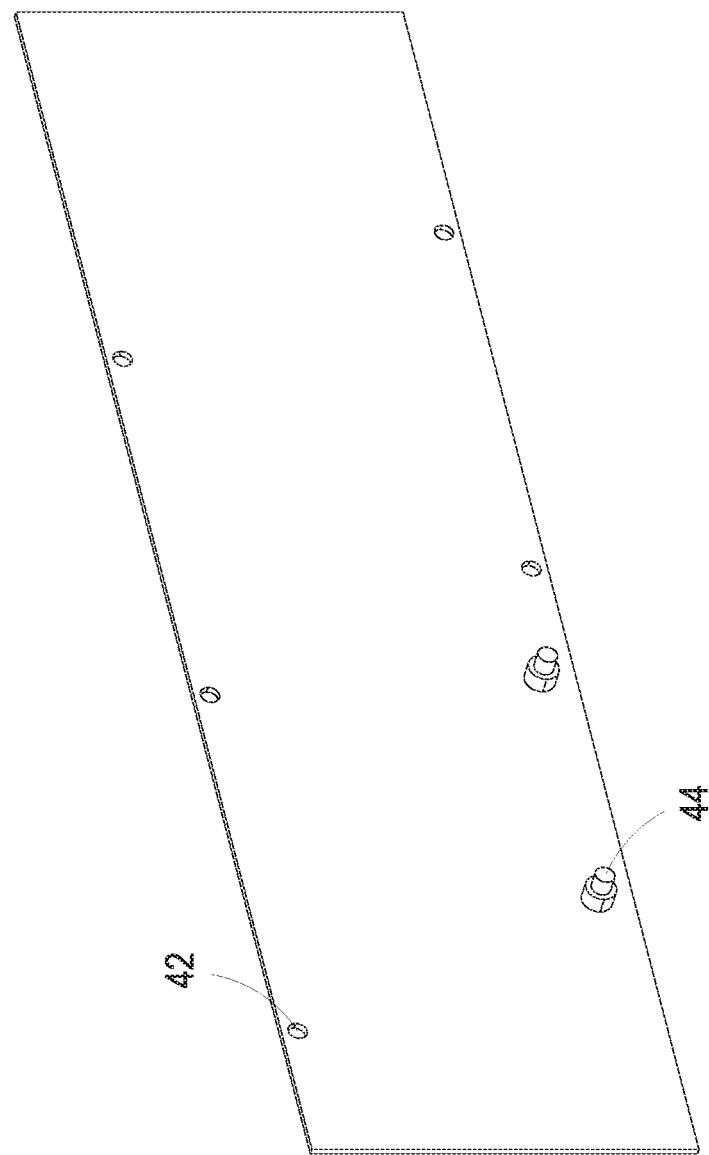

In the embodiment, the shielding structure 40 includes a plurality of apertures 41 disposed thereon, as shown in FIG. 3B, so as to achieve a better heat dissipation effect. Moreover, FIGS. 3B to 3F schematically show other different exemplary structures of the shielding structure of the present disclosure. As shown in FIG. 3B, the aperture 41 of the shielding structure 40a are partially arranged, and the shielding structure 40a is formed by a metal conductor or a non-metal skeleton sprayed with conductive paint. The present disclosure is not limited thereto. In an embodiment, as shown in FIG. 3C, at least one aperture 41 is disposed on the shielding structure 40b, and the shielding structure 40b includes a pipe 43. The pipe 43 is integrally formed with the shielding structure 40b, or tightly fit and passed through the shielding structure 40b. The second leading wire 32 (Referring to FIG. 1 and FIG. 2) passes through the pipe 43, that is, passes through the shielding structure 40b. In an embodiment, as shown in FIG. 3D, at least one aperture 41 is disposed on the shielding structure 40c, and the shielding structure 40c further includes a connection terminal 44. The connection terminal 44 is tightly fit and passes through the shielding structure 40c. The second leading wire 32 (Referring to FIG. 1 and FIG. 2) is electrically connected between the transformer 30 and the second circuit 20 through the connection terminal 44. In an embodiment, as shown in FIG. 3E, the shielding structure 40d includes at least one mounting hole 42 and a pipe 43, and the shielding structure 40d has no aperture. The mounting hole 42 is used for fixing the shielding structure 40d, and the pipe 43 allows the second leading wire 32 (Referring to FIG. 1 and FIG. 2) to pass through, so that the second leading wire 32 is electrically connected between the transformer 30 and the second circuit 20. In addition, FIG. 3F discloses another shielding structure 40e. The shielding structure 40e includes at least one mounting hole 42 and a connection terminal 44, and the shielding structure 40e has no aperture. The mounting hole 42 is used for fixing the shielding structure 40e. The connection terminal 44 is used for allowing the second leading wire 32 (Referring to FIG. 1 and FIG. 2) to be electrically connected between the transformer 30 and the second circuit 20. In other embodiments, the numbers and positions of the aperture 41, the mounting hole 42, the pipe 43 and the connection terminal 44 are adjustable according to the practical requirements.

Figure 4:
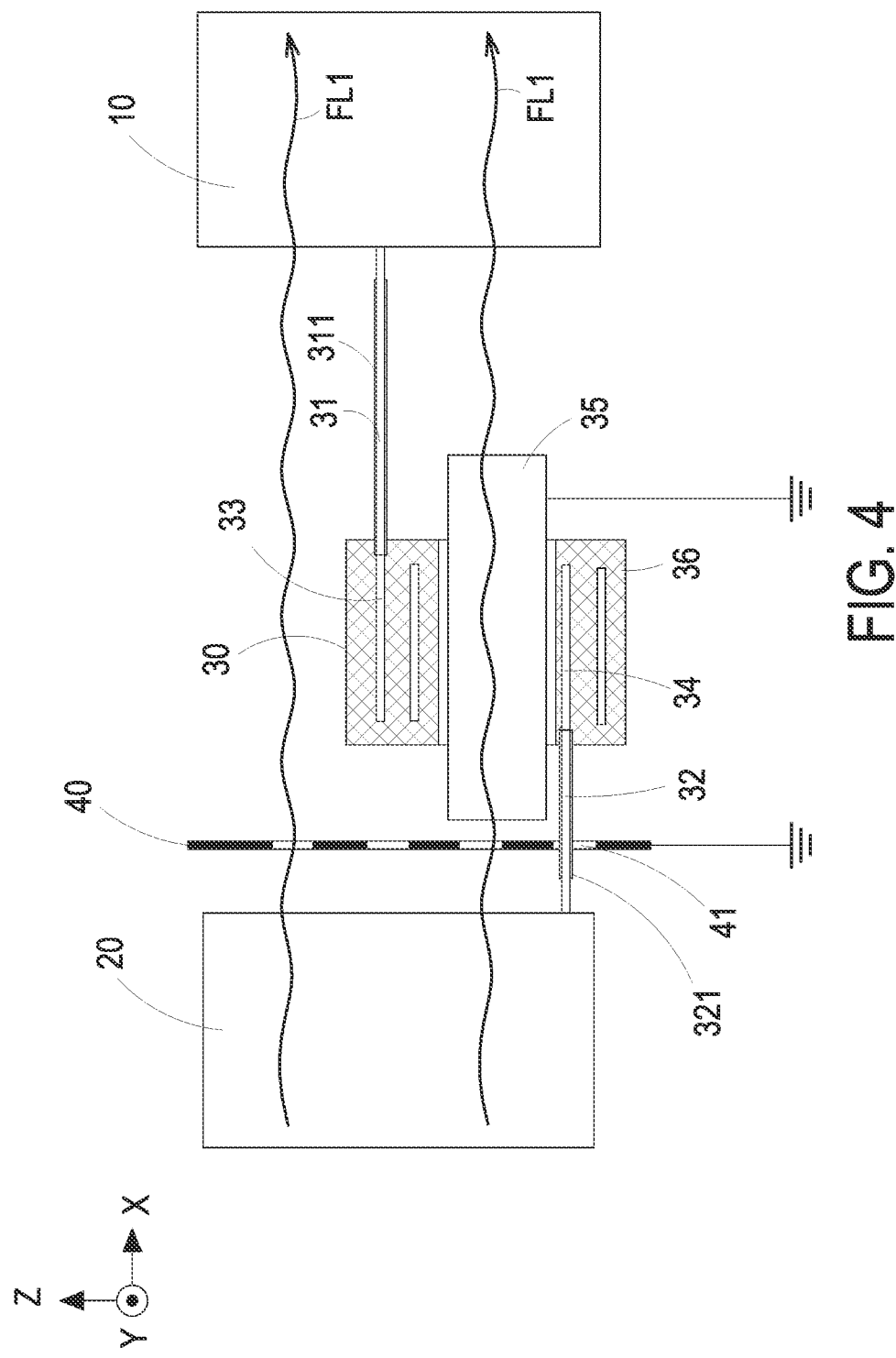
FIG. 4 is a schematic cross-sectional view illustrating a power module of an isolated converter according to a second embodiment of the present disclosure.

FIG. 4 is a schematic cross-sectional view illustrating a power module of an isolated converter according to a second embodiment of the present disclosure. In the embodiment, the structures, elements and functions of the power module 1a are similar to those of the power module 1 of FIG. 1 and FIG. 2, and are not redundantly described herein. In the embodiment, the power module 1a includes a second circuit 20, a shielding structure 40, a transformer 30 and a first circuit 10, for example, arranged along the X-axis direction. The shielding structure 40 is disposed between the transformer 30 and the second circuit 20. In the embodiment, the shielding structure 40 includes a plurality of apertures 41. Moreover, the second leading wire 32 passes through the shielding structure 40 and electrically connected between the second winding 34 of the transformer 30 and the second circuit 20 through the plurality of apertures 41. In addition, the plurality of apertures 41 are used for ventilation and heat dissipation. The power module 1a further includes at least one airflow channel FL1. The at least one airflow channel FL1 communicates with the first circuit 10, the transformer 30 and the second circuit 20 through the at least one aperture 41 of the shielding structure 40. Airflow of the at least one airflow channel FL1 flows through the second circuit 20, the aperture 41 of the shielding structure 40, the airflow channel of the transformer 30 and the first circuit 10 in sequence along the X-axis direction, so that the heat generated inside the power module 1a is dissipated effectively through the airflow channel FL1. In other words, the airflow channel FL1 is used for heat dissipation of the first circuit 10, the second circuit 20 and the transformer 30. The airflow channel FL1 is spatially corresponding to the aperture 41 of the shielding structure 40. In other embodiments, the flow direction of the airflow channel FL1 is in the reverse direction of the X axis or parallel to the XY plane. In other words, the overall air distribution of the power module 1a is considered to design the airflow channel FL1.

Figure 5:
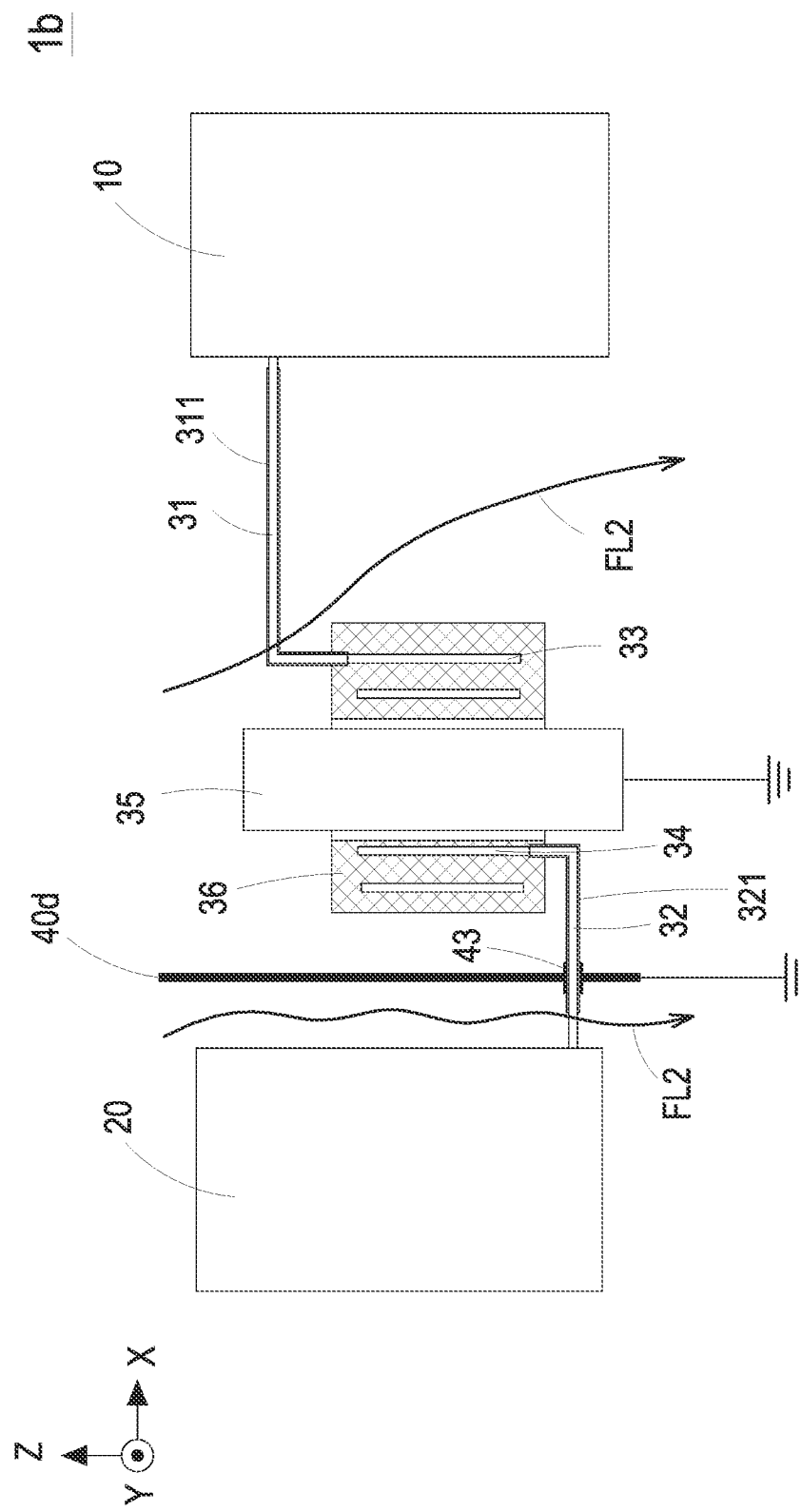
FIG. 5 is a schematic cross-sectional view illustrating a power module of an isolated converter according to a third embodiment of the present disclosure.

FIG. 5 is a schematic cross-sectional view illustrating a power module of an isolated converter according to a third embodiment of the present disclosure. In the embodiment, the structures, elements and functions of the power module 1b are similar to those of the power module 1 of FIG. 1 and FIG. 2, and are not redundantly described herein. Different from the power module 1 of FIG. 1 and FIG. 2, in the embodiment, the shielding structure 40d of the power module 1b is a shielding plate. That is, the aperture 41 of the shielding structure 40d may be dispensable. The second leading wire 32 is electrically connected between the second winding 34 of the transformer 30 and the second circuit 20 by passing through the pipe 43 of the shielding structure 40d. The power module 1b includes at least one airflow channel FL2, and the airflow channel FL2 is extended along one or both sides of the shielding structure 40d. Airflow of the airflow channel FL2 flows between the second circuit 20 and the shielding structure 40d in the Z-axis direction, or flows between the first circuit 10 and the shielding structure 40d in the Z-axis direction, so as to dissipate the heat from the first circuit 10, the second circuit 20 and the transformer 30. In other words, the overall air distribution of the power module 1b is considered to design of the airflow channel FL2.

Figure 6:
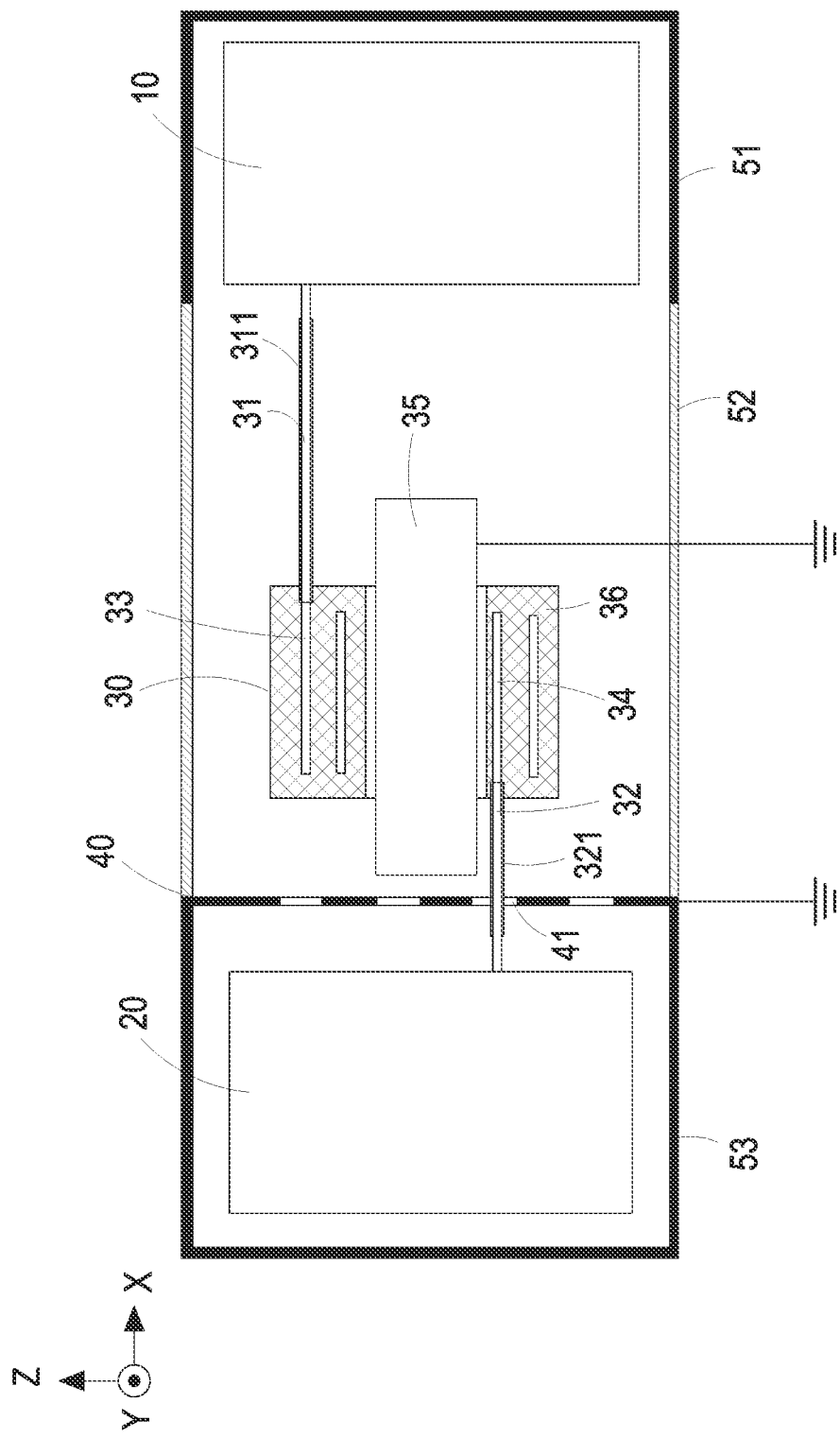
FIG. 6 is a schematic cross-sectional view illustrating a power module of an isolated converter according to a fourth embodiment of the present disclosure.

FIG. 6 is a schematic cross-sectional view illustrating a power module of an isolated converter according to a fourth embodiment of the present disclosure. In the embodiment, the structures, elements and functions of the power module 1c are similar to those of the power module 1 of FIG. 1 and FIG. 2, and are not redundantly described herein. In the embodiment, the power module 1c further includes a first housing 51, a second housing 52 and a third housing 53. The first circuit 10 is accommodated in the first housing 51. The transformer 30 is accommodated in the second housing 52. The second circuit 20 is accommodated in the third housing 53. The shielding structure 40 is fixed to the third housing 53, and located between the second housing 52 and the third housing 53. In the embodiment, the shielding structure 40 is shown in FIG. 3A. The shielding structure 40 is fastened to the third housing 53 with screws or bolts through the at least one mounting hole 42. The way of fixing the shielding structure 40 to the third housing 53 is not limited in the present disclosure. In the embodiment, the first housing 51 and the third housing 53 are formed by a metal material, and the second housing 52 is formed by an insulation material. The magnetic core 35 of the transformer 30 and the shielding structure 40 are both grounded. The first housing 51 is not grounded. By optimizing the arrangement of the first circuit 10, the transformer 30, the second circuit 20 and the shielding structure 40, the shielding structure 40 is maintained to be grounded and located between the second circuit 20 and the transformer 30, so as to reduce the safety compliance distance between the first circuit 10 and the second circuit 20 sufficiently. Furthermore, the shielding structure 40 is grounded in combination with the third housing 53. It is helpful for simplifying the assembly structure, and has the advantages of reducing cost, simplifying the process, improving the product yield and the product reliability.

Figure 7:
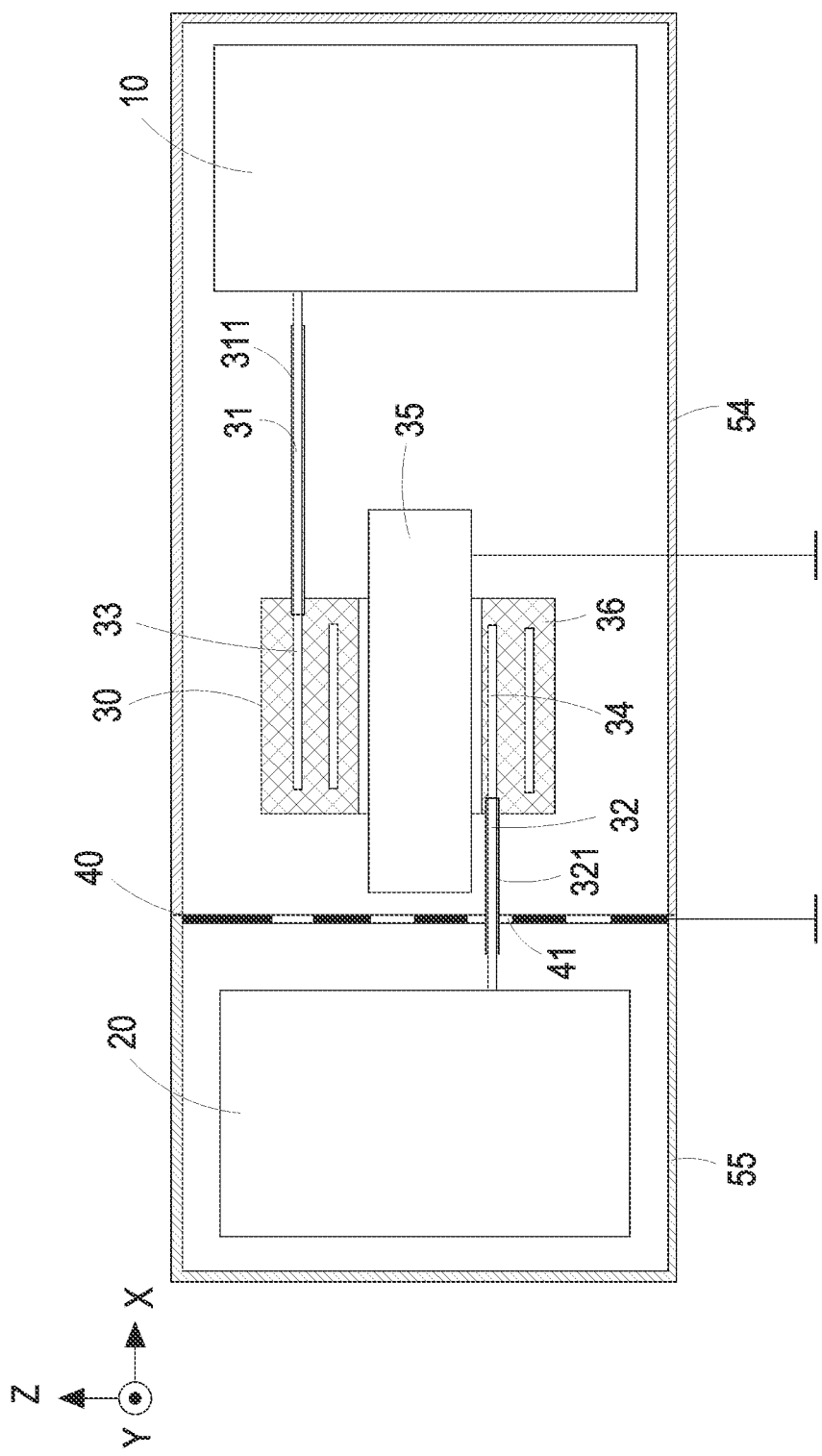
FIG. 7 is a schematic cross-sectional view illustrating a power module of an isolated converter according to a fifth embodiment of the present disclosure.

FIG. 7 is a schematic cross-sectional view illustrating a power module of an isolated converter according to a fifth embodiment of the present disclosure. In the embodiment, the structures, elements and functions of the power module 1d are similar to those of the power module 1 of FIG. 1 and FIG. 2, and are not redundantly described herein. In the embodiment, the power module 1*d* further includes a first housing 54 and a second housing 55. The first circuit 10 and the transformer 30 are accommodated in the first housing 54. The second circuit 20 is accommodated in the second housing 55. The shielding structure 40 is fixed to the second housing 55 and located between the first housing 54 and the second housing 55. In the embodiment, the first housing 54 and the second housing 55 are formed by an insulating material. The magnetic core 35 of the transformer 30 and the shielding structure 40 are maintained to be grounded. Since the shielding structure 40 is maintained to be grounded, the safety compliance distance between the first circuit 10 and the second circuit 20 is reduced sufficiently. Furthermore, the shielding structure 40 is fastened between the first housing 54 and the second housing 55 by bolts or screws through the mounting holes 42 (Referring to FIG. 3A). It is helpful for simplifying the assembly structure, reducing the cost, simplifying the manufacturing process, and improving the yield and reliability of the product.

Figure 8:
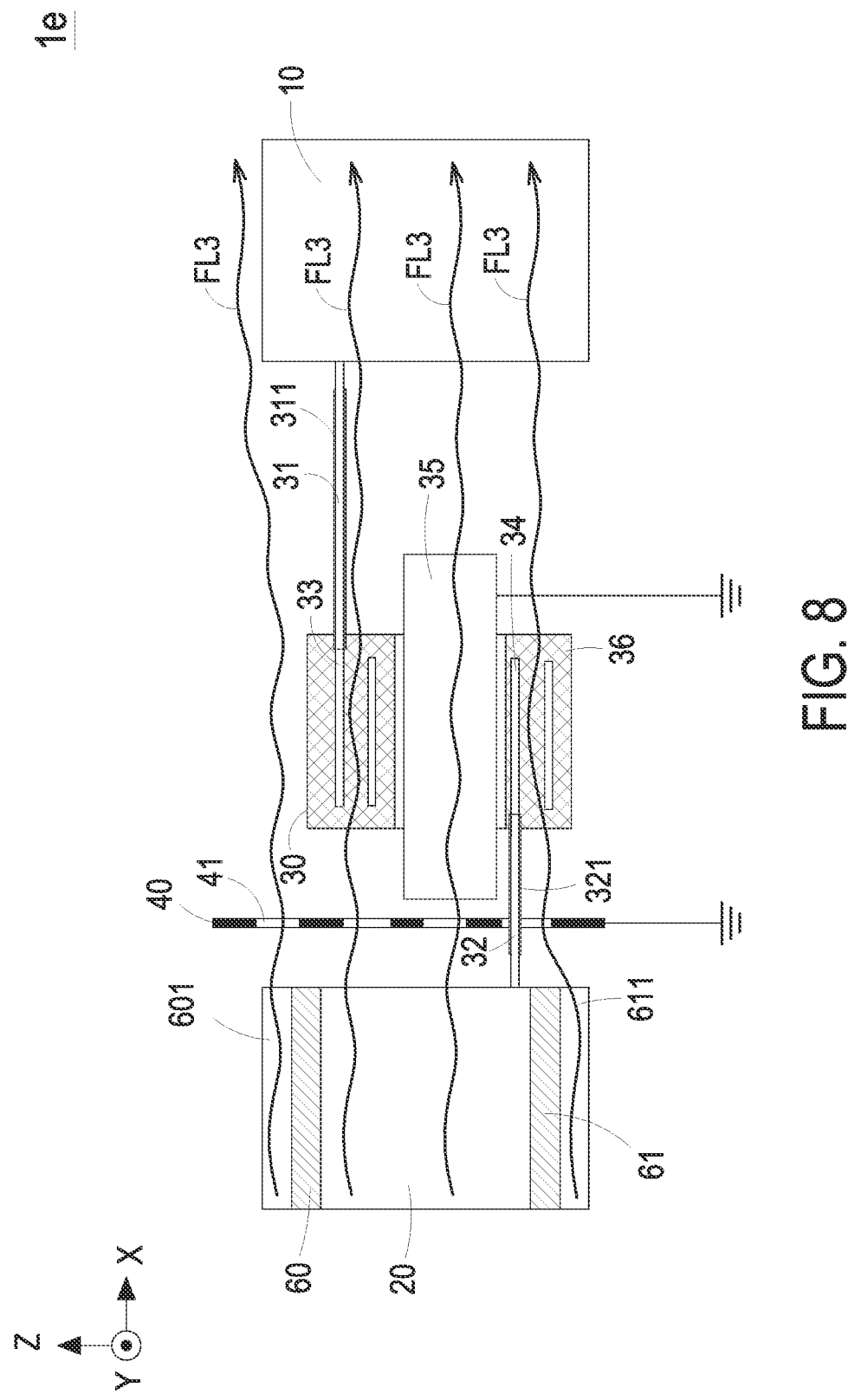
FIG. 8 is a schematic cross-sectional view illustrating a power module of an isolated converter according to a sixth embodiment of the present disclosure.

FIG. 8 is a schematic cross-sectional view illustrating a power module of an isolated converter according to a sixth embodiment of the present disclosure. In the embodiment, the structures, elements and functions of the power module 1*e* are similar to those of the power module 1 of FIG. 1 and FIG. 2, and are not redundantly described herein. In the embodiment, the power module 1*e* further includes at least one airflow channel FL3. The at least one airflow channel FL3 is in communication with the first circuit 10 and the transformer 30. In the embodiment, the power module 1*e* further includes two heat dissipation devices 60 and 61. The two heat dissipation devices 60 and 61 are metal heat sinks and disposed at a top end and a bottom end of the second circuit 20, respectively. The metal heat dissipation devices 60 and 61 are spatially corresponding to the aperture 41 of the shielding structure 40. In other embodiments, the power module 1*e* may only include one metal heat dissipation device, such as metal heat dissipation device 60 or 61. In an embodiment, the metal heat dissipation device 60 disposed on the top surface of the second circuit 20 has a plurality of fins 601, and the plurality of fins 601 are faced away from the second circuit 20. The plurality of fins 601 are extended along the Z-axis direction and arranged along the X-axis direction in parallel. In addition, the metal heat dissipation device 61 disposed on the bottom surface of the second circuit 20 includes a plurality of fins 611, and the plurality of fins 611 are faced away from the second circuit 20. The plurality of fins 611 are extended along the reverse Z-axis direction and arranged along the X-axis direction in parallel. The at least one airflow channel FL3 is in communication with the transformer 30 and the first circuit 10 through the plurality of fins 601, 611 and the apertures 41. Airflow of the at least one airflow channel FL3 flows through the heat dissipation device 60 and the heat dissipation device 61, the apertures 41 of the shielding structure 40, the transformer 30 and the first circuit 10 in sequence along the X-axis direction, so that the heat generated inside the power module 1*e* is dissipated effectively through the airflow channels FL3. In other words, the airflow channel FL3 is used to dissipate the heat generated from the first circuit 10 and the transformer 30. In the embodiment, the shielding structure 40 has a height greater than a height of the second circuit 20, so that the plurality of fins 601 of the heat dissipation device 60 and the plurality of fins 611 of the heat dissipation device 61 are spatially corresponding to the apertures 41 of the shielding structure 40 directly. It is helpful for improving the efficiency of the airflow channels FL3 to dissipate the heat generated inside the power module 1*e*. In other embodiments, the height of the shielding structure 40 is smaller than the height of the second circuit 20, the airflow of the at least one air channel FL3 flows through the heat dissipation devices 60 and 61, the transformer 30 and the first circuit 10 in sequence along the X-axis direction. Thus, the heat generated inside the power module 1*e* is dissipated through the airflow channel FL3 effectively.

In the embodiment, the heat dissipation devices 60, 61 are connected to the second circuit 20. Further, the heat dissipation device 60 is connected to the second circuit 20, so that the potentials of the heat dissipation device 60 and the second circuit 20 are the same. The heat dissipation devices 60, 61 and the second circuit 20 are attached to each other closely, so as to reduce the size of the power module 1*e*.

Figure 9:
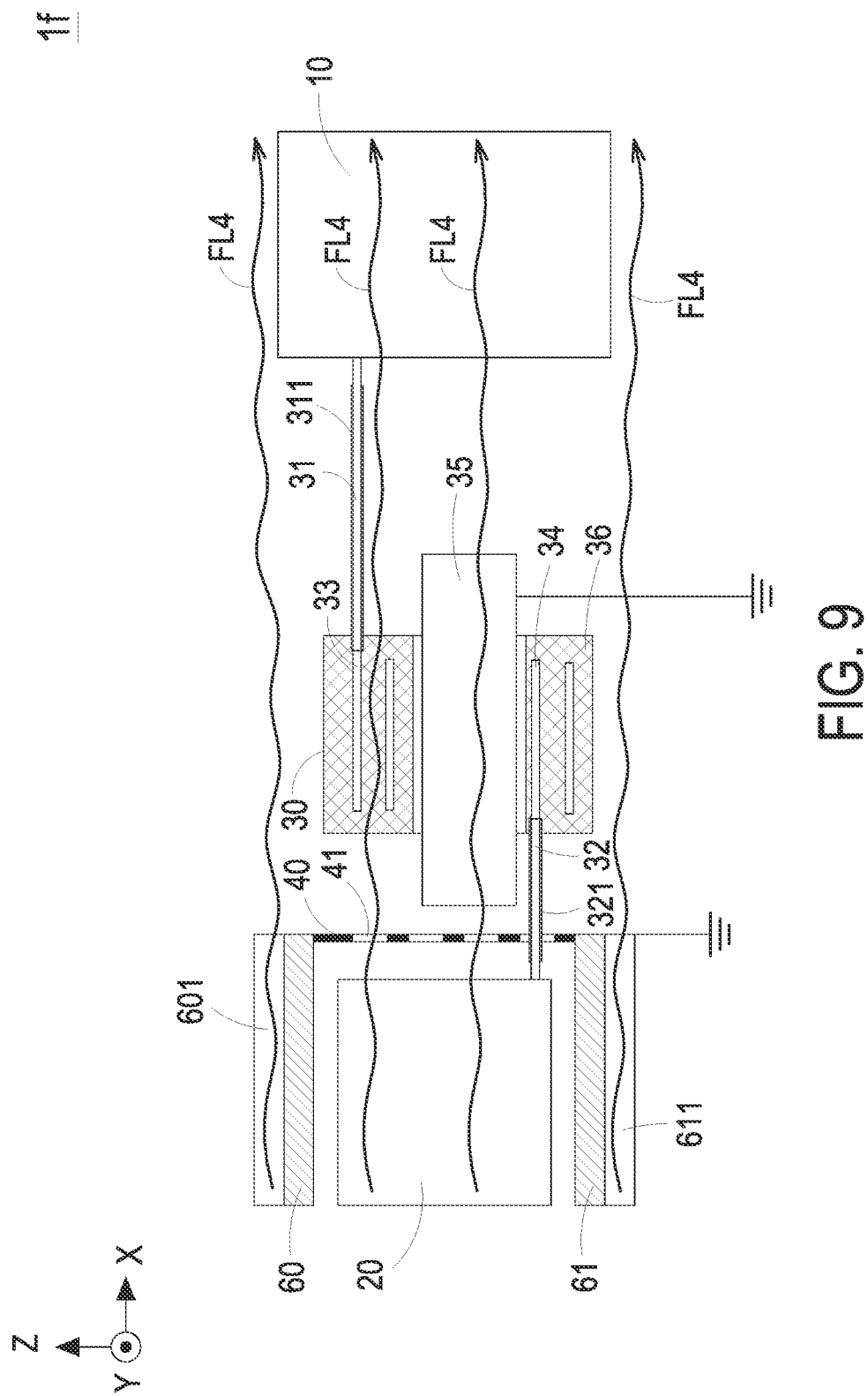
FIG. 9 is a schematic cross-sectional view illustrating a power module of an isolated converter according to a seventh embodiment of the present disclosure.

FIG. 9 is a schematic cross-sectional view illustrating a power module of an isolated converter according to a seventh embodiment of the present disclosure. In the embodiment, the structures, elements and functions of the power module 1*f* are similar to those of the power module 1 of FIG. 1 and FIG. 2, and are not redundantly described herein. In the embodiment, the power module 1*f* further includes at least one airflow channel FL4, and the at least one airflow channel FL4 is in communication with the first circuit 10 and the transformer 30. The power module 1*f* further includes two heat dissipation devices 60, 61. The two heat dissipation devices 60, 61 are metal heat sinks, disposed at a top end and a bottom end of the second circuit 20, respectively, and connected to two opposite ends of the shielding structure 40, respectively. In the embodiment, the height of the shielding structure 40 is greater than the height of the second circuit 20. In the embodiment, the metal heat dissipation device 60 includes a plurality of fins 601 faced away from the second circuit 20. The plurality of fins 601 are extended along the Z-axis direction and arranged along the X-axis direction in parallel. In addition, the metal heat dissipation device 61 includes a plurality of fins 611, and the plurality of fins 611 are faced away from the second circuit 20. The plurality of fins 611 are extended along the reverse Z-axis direction, and arranged along the X-axis direction in parallel. The at least one airflow channel FL4 passes through the plurality of fins 601, 611 or the apertures 41, and in communication with the transformer 30 and the first circuit 10. Airflow of the least one airflow channel FL4 flows from the heat dissipation device 60 and the heat dissipation device 61 through the transformer 30 and the first circuit 10 in sequence along the X-axis direction, or flows from the space between the second circuit 20 and the heat dissipation devices 60, 61 through the apertures 41 of the shielding structure 40, the transformer 30 and the first circuit 10 in sequence along the X-axis direction, so that the heat generated inside the power module 1*f* is dissipated effectively through the airflow channel FL4. It is helpful for improving the heat dissipation efficiency of the power module 1*f*. In the embodiment, at least one of the heat dissipation devices 60, 61 and the shielding structure 40 are grounded. Since the shielding structure 40 is combined with the metal heat dissipation devices 60, 61 to ground, it is helpful for reducing the size of the shielding structure 40, and increasing the ventilation and heat dissipation of the power module 1*f*. Furthermore, it is beneficial for simplifying the assembly structure, reducing the cost, simplifying the manufacturing process and improving the yield and reliability of the product. In other embodiments, the metal heat dissipation devices 60, 61 are disposed at the top, bottom or middle ends of the second circuit 20, and the metal heat dissipation devices 60, 61 are grounded or connected to the second circuit 20.

Figure 10:
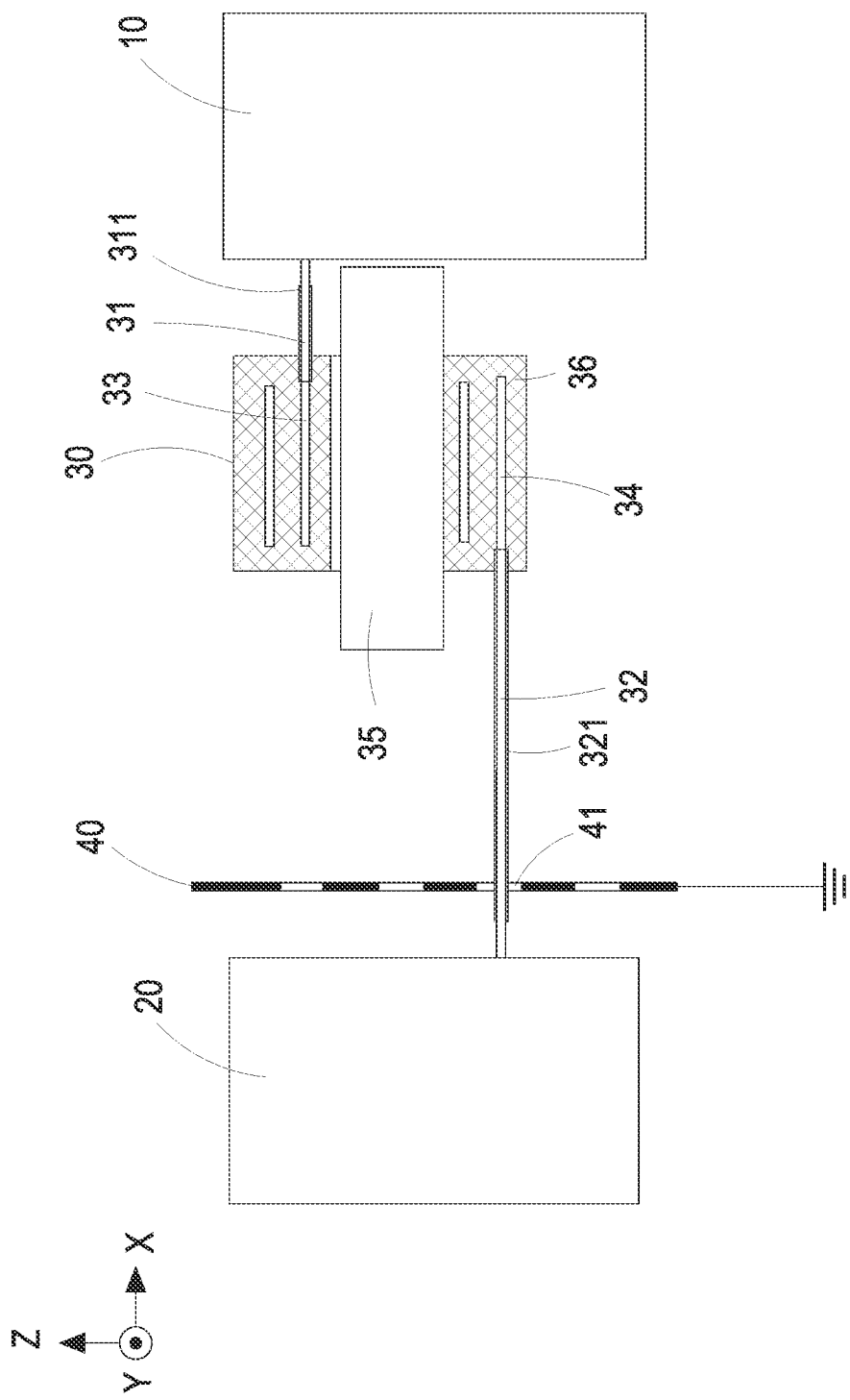
FIG. 10 is a schematic cross-sectional view illustrating a power module of an isolated converter according to an eighth embodiment of the present disclosure.

FIG. 10 is a schematic cross-sectional view illustrating a power module of an isolated converter according to an eighth embodiment of the present disclosure. In the embodiment, the structures, elements and functions of the power module 1g are similar to those of the power module 1 of FIG. 1 and FIG. 2, and are not redundantly described herein. In the embodiment, the transformer 30 and the first circuit 10 of the power module 1g are disposed adjacent to each other. The magnetic core 35 of the transformer 30 is connected to the first circuit 10. The transformer 30 is connected to a certain node of the first circuit 10. The first winding 33, for example the high-voltage winding, is wounded around a magnetic column of the magnetic core 35, and the second winding 34, for example the low-voltage winding, is disposed around an outside of the first winding 33. Since the potentials of the first winding 33 and the magnetic core 35 are the same, there is no need for basic insulation between the first winding 33 and the magnetic core 35. It is helpful for reducing the volume of the transformer 30 and further improving the power density of the power module 1g.

Figure 11:
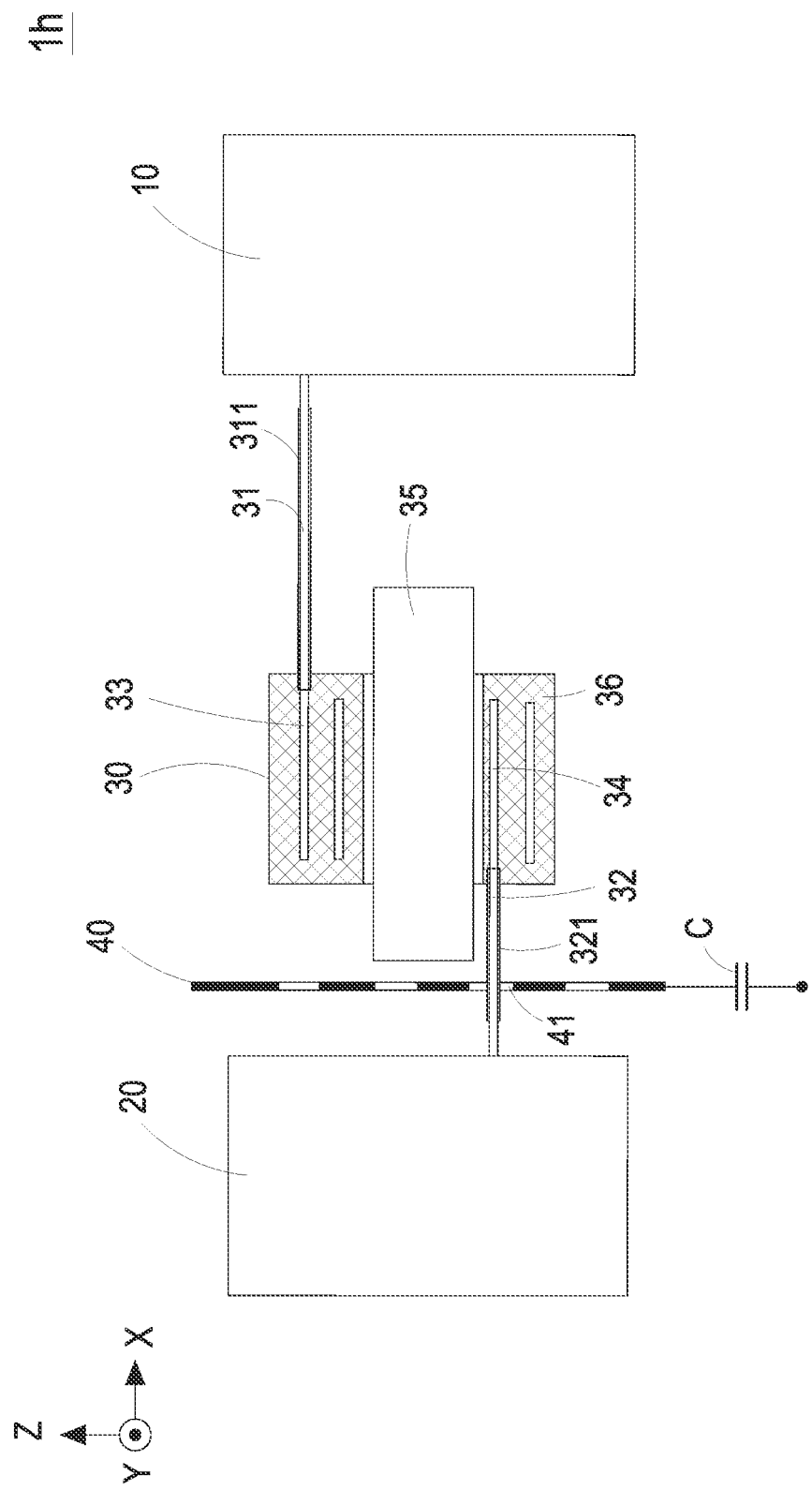
FIG. 11 is a schematic cross-sectional view illustrating a power module of an isolated converter according to a ninth embodiment of the present disclosure.

FIG. 11 is a schematic cross-sectional view illustrating a power module of an isolated converter according to a ninth embodiment of the present disclosure. In the embodiment, the structures, elements and functions of the power module 1h are similar to those of the power module 1 of FIG. 1 and FIG. 2, and are not redundantly described herein. In the embodiment, the power module 1h further includes a capacitor C. The shielding structure 40 is electrically connected to the second circuit 20 through the capacitor C. In the embodiment, for example, the potential of the first circuit 10 is 10 kV, and the potential of the second circuit 20 is 6 kV. The potential of the shielding structure 40 is equal to the potential of the second circuit 20. In other words, the shielding structure 40 is maintained at a constant potential, that is, the potential of the second circuit 20. However, the shielding structure 40 and the second circuit 20 are separated from each other. Once the basic insulation between the first circuit 10 and the second circuit 20 fails, a potential of 10 kV will be applied to the shielding structure 40. Since the capacitance value of the capacitor C is large, the potential of the shielding structure 40 is not raised in a short time. The protection of the circuit components and devices on the side of the second circuit 20 is achieved and the possible damage is avoided.

In summary, the present disclosure provides a power module of a medium-high-voltage isolated converter. By arranging the shielding structure in the power module, the insulation grade between the high-voltage circuit and the low-voltage circuit is changed from reinforced insulation to basic insulation, so that the internal safety compliance distance of the power module is reduced. Furthermore, by optimizing the arrangement of the high-voltage circuit, the transformer, the low-voltage circuit and the shielding structure, the safety compliance distance between high-voltage circuit and low-voltage circuit is reduced sufficiently, and the overall volume of the power module and the overall weight of the power module are reduced. The power density is increased by 15%. In addition, an airflow channel is formed in the power module of the medium-high-voltage isolated converter for sharing, and combined with the heat sink and the shielding structure in the structural design. In that, the design of the airflow channel is further simplified, the cost of the power module is reduced, and the competitiveness of the power module is enhanced. By optimizing the arrangement of the high-voltage circuit, the transformer, the low-voltage circuit and the shielding structure, the shielding structure is maintained at a constant potential, and it is helpful for reducing the safety compliance distance between the high-voltage circuit and the low-voltage circuit. Furthermore, the shielding structure is grounded in combination with the heat sink or the housing, or connected to a second circuit, so that the shielding structure is maintained at a constant potential. It is beneficial for simplifying the assembly structure, reducing the cost, simplifying the manufacturing process and improving the yield and reliability of the product.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:
a first circuit;
a second circuit, wherein a potential of the first circuit is greater than a potential of the second circuit;
a transformer comprising a first leading wire electrically connected to the first circuit, and a second leading wire electrically connected to the second circuit; and
a shielding structure disposed between the transformer and the second circuit, wherein the second leading wire is electrically connected between the transformer and the second circuit through the shielding structure, and the shielding structure is maintained at a constant potential.

2. The power module according to claim 1, wherein the transformer comprises a magnetic core, a first winding and a second winding, the first winding and the second winding are disposed around a magnetic column of the magnetic core, respectively, the first winding is electrically connected to the first circuit through the first leading wire, and the second winding is electrically connected to the second circuit through the second leading wire.

3. The power module according to claim 2, wherein the magnetic core and the shielding structure are both grounded.

4. The power module according to claim 2, wherein the magnetic core is in contact with the shielding structure, and the shielding structure is grounded.

5. The power module according to claim 2, wherein the magnetic core is connected to the first circuit, the first winding is wounded around the magnetic column of the magnetic core, and the second winding is disposed around an outside of the first winding.

6. The power module according to claim 1, wherein the first leading wire and the second leading wire are sleeved with an insulation sleeve, respectively.

7. The power module according to claim 1, wherein the shielding structure comprises at least one aperture, and the at least one aperture has a diameter less than or equal to a distance from the shielding structure to the second circuit.

8. The power module according to claim 7, wherein the second leading wire passes through the shielding structure through the at least one aperture.

9. The power module according to claim 7, further comprising at least one airflow channel, wherein the at least one airflow channel connects with the first circuit, the transformer and the second circuit through the at least one aperture.

10. The power module according to claim 1, further comprising at least one airflow channel, wherein the at least one airflow channel connects with the first circuit and the transformer.

11. The power module according to claim 10, further comprising at least one heat dissipation device disposed on a top end or a bottom end of the second circuit, wherein the at least one heat dissipation device comprises a plurality of fins, and the plurality of fins are faced away from the second circuit.

12. The power module according to claim 11, wherein the at least one heat dissipation device is connected to the second circuit.

13. The power module according to claim 11, wherein the shielding structure comprises at least one aperture, and the at least one airflow channel connects with the transformer and the first circuit through the plurality of fins and the at least one aperture.

14. The power module according to claim 11, wherein the at least one heat dissipation device is connected to the shielding structure.

15. The power module according to claim 14, wherein the shielding structure has a height greater than a height of the second circuit.

16. The power module according to claim 1, wherein the shielding structure comprises a pipe, and the second leading wire passes through the shielding structure through the pipe.

17. The power module according to claim 1, wherein the shielding structure comprises a connection terminal, and the second leading wire is electrically connected between the transformer and the second circuit through the connection terminal.

18. The power module according to claim 1, further comprising at least one airflow channel, wherein airflow of the at least one airflow channel flows along at least one side of the shielding structure.

19. The power module according to claim 1, further comprising a first housing, a second housing and a third housing, wherein the first circuit is accommodated in the first housing, the transformer is accommodated in the second housing, the second circuit is accommodated in the third housing, and the shielding structure is fixed to the third housing and located between the second housing and the third housing, wherein the first housing and the third housing are formed by a metal material, and the second housing is formed by an insulation material.

20. The power module according to claim 1, further comprising a first housing and a second housing, wherein the first circuit and the transformer are accommodated in the first housing, the second circuit is accommodated in the second housing, and the shielding structure is fixed to the second housing and located between the first housing and the second housing, wherein the first housing and the second housing are formed by an insulation material.

21. The power module according claim 1, further comprising a capacitor, wherein the shielding structure is electrically connected to the second circuit through the capacitor.

22. The power module according to claim 1, wherein the shielding structure is a metal shielding plate, a metal shielding mesh, a metal conductor or a conductive sprayed body.

* * * * *